United States Patent [19]
Van Buskirk et al.

[11] Patent Number: 5,741,363
[45] Date of Patent: Apr. 21, 1998

[54] INTERIORLY PARTITIONED VAPOR INJECTOR FOR DELIVERY OF SOURCE REAGENT VAPOR MIXTURES FOR CHEMICAL VAPOR DEPOSITION

[75] Inventors: Peter C. Van Buskirk, Newtown, Conn.; James A. Fair, Mountain View, Calif.; David E. Kotecki, Hopewell Jct., N.Y.

[73] Assignees: Advanced Technology Materials, Inc., Danbury, Conn.; International Business Machines Corporation, Armonk, N.Y.; Varian Corporation, Palo Alto, Calif.

[21] Appl. No.: 621,088

[22] Filed: Mar. 22, 1996

[51] Int. Cl.$^6$ .................................. C23C 16/00
[52] U.S. Cl. .............. 118/715; 204/298.07; 156/345
[58] Field of Search .............. 118/715; 204/298.07; 156/345

[56] References Cited

U.S. PATENT DOCUMENTS

| | | | |
|---|---|---|---|
| 3,098,763 | 7/1963 | Deal et al. | 118/724 |
| 3,517,643 | 6/1970 | Goldstein et al. | 118/715 |
| 3,578,495 | 5/1971 | Pammer et al. | 437/238 |
| 4,313,783 | 2/1982 | Davies et al. | 156/643 |
| 4,340,568 | 7/1982 | Hirai et al. | 118/715 |
| 4,508,054 | 4/1985 | Baumberger et al. | 118/718 |
| 4,751,192 | 6/1988 | Hirooka et al. | 437/4 |
| 4,798,165 | 1/1989 | DeBoer et al. | 118/715 |
| 4,807,562 | 2/1989 | Sandys | 118/725 |
| 4,820,371 | 4/1989 | Rose | 156/345 |
| 4,825,809 | 5/1989 | Mieno | 118/725 |
| 4,909,914 | 3/1990 | Chiba et al. | 204/164 |
| 4,987,856 | 1/1991 | Hey et al. | 118/723 E |
| 4,989,541 | 2/1991 | Mikoshiba et al. | 118/723 MG |
| 4,991,541 | 2/1991 | Sugata et al. | 118/716 |
| 4,993,358 | 2/1991 | Mahawili | 118/715 |
| 5,000,113 | 3/1991 | Wang et al. | 118/723 E |
| 5,105,761 | 4/1992 | Charlet et al. | 118/723 ME |

(List continued on next page.)

FOREIGN PATENT DOCUMENTS

| | | |
|---|---|---|
| 0 090 586 | 10/1983 | European Pat. Off. . |
| 0 540 082 A1 | 5/1993 | European Pat. Off. . |
| 1597833 | 6/1970 | France . |
| 3635647A1 | 10/1986 | Germany . |
| 3715644 A1 | 12/1988 | Germany . |
| 53-91764 | 7/1978 | Japan . |
| 57-48226 | 3/1982 | Japan . |
| 60-98629 | 6/1985 | Japan ............................ 156/345 |
| 60-202937 | 10/1985 | Japan . |
| 61-87319 | 5/1986 | Japan ............................ 118/728 |
| 61-175148 | 7/1988 | Japan . |
| 1-168022 | 7/1989 | Japan . |
| 2-73624 | 3/1990 | Japan ............................ 118/724 |
| WO90/10092 | 9/1990 | WIPO . |

*Primary Examiner*—R. Bruce Breneman
*Assistant Examiner*—Jeffrie R. Lund
*Attorney, Agent, or Firm*—Steven J. Hultquist

[57] ABSTRACT

A showerhead disperser device for mixing plural vapor streams, comprising: a housing including front and rear walls in spaced apart relation to one another, and a side wall therebetween, defining within the housing an interior volume; the front wall having a multiplicity of vapor mixture discharge openings therein, for discharging mixed vapor from the interior volume of the housing exteriorly thereof, flow passages joined to the housing for introducing into the interior volume of the housing respective fluids to be mixed therein; and at least one baffle plate mounted in the interior volume of the housing, intermediate the front and rear walls of the housing, the baffle plate having an edge in spaced relation to the side wall to form an annular flow passage therebetween and the baffle plate having at least one of the respective fluids directed thereagainst upon introduction to the interior volume of the housing, for distribution thereof in the interior volume of the housing. The baffled showerhead disperser is usefully employed to enable formation of CVD thin films of highly uniform composition and thickness.

18 Claims, 5 Drawing Sheets

U.S. PATENT DOCUMENTS

| | | | |
|---|---|---|---|
| 5,106,453 | 4/1992 | Benko et al. | 156/613 |
| 5,134,963 | 8/1992 | Barbee et al. | 118/715 |
| 5,174,825 | 12/1992 | White, Jr. et al. | 118/715 |
| 5,186,756 | 2/1993 | Benko et al. | 118/730 |
| 5,268,034 | 12/1993 | Vukelic | 118/719 |
| 5,286,519 | 2/1994 | Vukelic | 427/99 |
| 5,366,557 | 11/1994 | Yu | 118/725 |
| 5,387,289 | 2/1995 | Schmitz et al. | 118/725 |
| 5,422,139 | 6/1995 | Fischer | 427/248.1 |
| 5,453,124 | 9/1995 | Moslehi et al. | 118/715 |
| 5,462,014 | 10/1995 | Awaya et al. | 118/725 |

5,741,363

INTERIORLY PARTITIONED VAPOR INJECTOR FOR DELIVERY OF SOURCE REAGENT VAPOR MIXTURES FOR CHEMICAL VAPOR DEPOSITION

BACKGROUND OF THE INVENTION

1. Field of the Invention

This invention relates to an interiorly partitioned vapor injector, having particular utility for delivery of source reagent vapor mixtures, e.g., comprising one or more precursor reagents in mixture with oxidant, carrier, and/or other reactant or non-reactant species, to a chemical vapor deposition locus, for chemical vapor deposition of selected component(s) of the precursor reagent(s) on a substrate.

2. Background of the Invention

In the practice of chemical vapor deposition (CVD), a source reagent vapor mixture, which may for example comprise one or more precursor reagents in admixture with oxidant and/or carrier species, is delivered to a chemical vapor deposition locus, for chemical vapor deposition of selected component(s) of such precursor reagent(s) on a substrate.

The CVD system for carrying out such deposition may therefore include bubblers, liquid delivery systems, or solid delivery systems for supplying the precursor reagents, which are brought into mixture with oxidant, adjuvant, and/or carrier gases, to provide a source reagent vapor mixture whose composition and whose attendant process conditions (temperature, pressure, flow rate) are critical to the formation and stoichiometry of the film ultimately is deposited on the substrate.

The art has described the provision of so-called "showerhead"-type dispersers for the introduction of reagent vapor into CVD reactors. U.S. patent application No. application No. 08/402,142 filed Mar. 10, 1995 in the name of Peter C. Van Buskirk, describes a showerhead disperser for use in CVD systems and incorporating a heat transfer structure whereby the temperature of the reagent-containing stream being flowed from the outlet of the disperser is controllably maintained at a desired temperature level, for efficient CVD operation. More specifically, the showerhead disperser housing comprises an array of heat exchange passages in the housing wall that are disposed in heat transfer relationship to the source reagent vapor discharge passages in the housing wall, with each of the heat exchange passages being in spaced-apart heat transfer relationship to a multiplicity of source reagent vapor discharge passages in the array of discharge passage openings at the face of the disperser housing.

Such showerhead disperser, while providing for effective thermal control of the dispersed source reagent-containing stream being flowed to the CVD reactor, does not fully satisfactorily accommodate the need for extremely high uniformity of concentration and flow rate in the dispersed gas discharged from the disperser.

In many CVD applications, any significant non-uniformity in the gas stream, either of a compositional character (such that significant gradients of composition are created in the discharged gas stream) or of a flow rate character (such that significant flow velocity gradients are created in the discharged gas stream) will result in wholly unsatisfactory operation and inferior deposited films on the substrate being coated with the desired components of the source reagent vapor. Further, the mixing of the precursor components with an oxidizer, carrier gas, or other components in the disperser housing must be highly efficient, to avoid such localized variation in the composition and flow rate of the gas stream being discharged from the disperser.

Thus, the stoichiometry of the deposited film in the CVD system typically must be rigorously controlled for the manufacture of thin film layers of proper composition, and high uniformity of the thickness of the deposited film is generally desired and necessary. If the deposited material film deviates from the desired stoichiometry and/or thickness uniformity requirements, the resulting article formed from the film, e.g., a microelectronic device such as a dynamic random access memory, may be deficient or even useless for its intended purpose.

By way of further specific background, there are a number of issues associated with the mixing of large metal-organic molecules (e.g., Ba(thd), Sr(thd), etc.) with lighter molecules (e.g., oxidizers, $O_2$, $N_2O$, $O_3$, etc., or sulfur sources, such as $H_2S$, etc.) which are used for the chemical vapor deposition of thin films of high-dielectric constant, ferroelectric, and related materials. In the mixing region of the chemical vapor deposition reactor:

(1) the gases and walls of the reactor must be maintained at a constant temperature above the condensation temperature but below the molecular decomposition temperature;

(2) all mixing between different reagents, such as oxidizers ($O_2$ and $N_2O$) and the metal precursors, such as Ba(thd)$_2$, needs to take place in a low pressure region so as to reduce the probability of gas-phase reactions; and (3) all of the gas components must mix completely to form a homogeneous concentration at the surface of the gas injector to the chemical vapor deposition reactor, which may for example comprise a showerhead-type injector. Variations in reactant concentration across the injector will lead to the deposition of non-uniform film thickness and composition across the substrate.

There is, correspondingly, a need in the art for an improved showerhead-type disperser for the controlled discharge of source reagent-containing vapor streams for CVD and other vapor deposition applications.

SUMMARY OF THE INVENTION

The present invention is directed to a vapor injector apparatus and corresponding method, having utility for delivery of source reagent vapor mixtures, e.g., comprising one or more precursor reagents in mixture with oxidant and/or carrier, to a chemical vapor deposition locus, for chemical vapor deposition on a substrate of selected component(s) of the precursor reagent(s). The vapor injector apparatus of the present invention provides a highly efficient means for discharging mixed vapor of superior uniformity characteristics of composition and flow rate (velocity) and is suitable for use with metal-organic reagents capable of depositing films of BaT, BiST, other high-epsilon materials such as ST and PLT, and ferroelectric materials such SBTa, PZT, PLZT, and the like (where B=bismuth, T=titanate, Ta=tantalate, S=strontium, P=lead, Z=zirconium, and L=lanthanum).

The present invention in a particular aspect relates to a shower head discharge device having utility for dispersing a source reagent vapor comprising oxidant and precursor reagent, for transport of the source reagent vapor to a deposition substrate in a CVD reactor.

In one embodiment, the shower head discharge device of the invention includes a housing having front and rear walls in spaced-apart relationship to one another, and a side wall therebetween, with the front and rear walls preferably being substantially parallel to one another. The housing walls define an interior volume therewithin, in which a precursor reagent and an oxidant or other fluid stream may be mixed. The front wall has an array of source reagent vapor openings extending therethrough for discharging source reagent vapor from the interior volume of the housing through the openings for flow to a deposition surface in a CVD reactor.

A feed conduit assembly is coupled with the housing in flow communication with the interior volume of the housing, for directing a precursor reagent and an oxidant and/or other stream(s) into the housing. The feed conduit assembly may include a plurality of separate conduits in any suitable arrangement such that the respective fluid streams to be mixed may be transported independently to the housing, for subsequent mixing therein.

At least one baffle plate is mounted within the interior volume of the housing to effectuate enhanced mixing of the respective fluid streams in the interior volume of the housing and increased homogeneity in the subsequently discharged vapor (relative to a housing lacking such baffle means). Such baffle plate(s) may be disc-shaped, and preferably is disposed in substantially parallel, spaced-apart relation with respect to the front and rear walls.

The diameter of the baffle plate(s) is selected to be smaller than the lateral dimension of the side walls, such that there is an annular spacing (determined by the difference in the diameter of the baffle and the lateral dimension of the side walls through which the reagent and the oxidant may pass to reach the openings in the front wall). This annular passage provides a highly efficient mixing site for the achievement of superior homogeneity in the discharged vapor, and further ensures hydrodynamically efficient flow. By such baffled arrangement, the disperser provides a high degree of uniformity in the volumetric flow rate, velocity, and concentration of the vapor discharged through the wall openings at the front wall of the housing. Accordingly, the resulting flow of reagent-containing vapor is highly uniform over the full transverse extent of the front wall of the housing. This in turn provides a highly uniform flow rate and composition in the reagent-containing vapor impinged on the deposition substrate in the CVD reactor. The resulting thin films deposited on the substrate in the CVD reactor are therefore significantly higher in uniformity of thickness and compositionally more homogeneous, than has heretofore been possible with the disperser designs of the prior art.

In order to maximize the uniformity of mixing of the respective feed streams in the disperser housing in the broad practice of the invention, it is preferred that the housing be of a geometrically regular shape, e.g., having walls defining a cylindrical shape, such that the annular passage defined between the inner surface of the housing and the edge of the baffle is of uniform radial (lateral) dimension, about the full circumferential extent of the annular passage. Alternatively, the housing may have a square cross-section or other geometrically regular shape.

The baffle plate(s) disposed in the interior volume of the housing in the disperser of the present invention, may be perforate or imperforate in character. If the baffle assembly comprises more than one plate member, each of the respective plates preferably is coaxiallly arranged with respect to the others in the housing, being preferably disposed in parallel and axially spaced-apart relationship to one another, with the outermost plate members in the multi-plate array being disposed in spaced-apart relationship to the adjacent front and rear walls of the housing.

In a preferred aspect, the housing comprises a cylindrical housing having a pair of spaced-apart imperforate circular baffle plates which are coaxially and parallelly aligned in the interior volume of the housing, with respect to each other and to the front and rear walls of the housing.

The dimensions of the baffled disperser of the present invention, may be varied in the broad practice of the invention. The specific dimensions, size and shape characteristics may be readily varied and optimized without undue experimentation within the skill of the art, to achieve a desired structural and functional character of the disperser for a given end use application (for example, to achieve the objective of maximizing the mixing of the respective streams introduced to the interior volume of the housing, while minimizing the occurrence of degradation reactions in the mixed vapor in the housing interior volume).

The dimensions and operating variables of the baffled disperser of the invention which may be selectively varied in the broad practice of the invention include the following variables:

the interior volume of the housing, $V_i$;

the lateral dimension (diameter) of the housing, D;

the interior axial length of the housing (from the rear wall to the front wall), L;

the total cross-sectional area of baffle plate(s), $A_b$;

the area (total) of the front wall vapor egresses, $A_o$;

the baffle plate(s) thickness, t;

the baffle plate position along the z-axis of the housing, z/L (z being taken here as the distance measured from the front wall of the housing);

the diameter of the baffle plate openings (when the baffle is of perforate or foraminous character), d;

the volumetric flow rate of precursor into the disperser housing, Qp;

the volumetric flow rate of oxidant or other feed stream introduced in the interior volume of the housing for mixing therein with the precursor stream, Qo;

the cross-sectional area of precursor feed conduit, Af;

the cross-sectional area of oxidant (or other added stream) feed conduit, Ag; and the annular radial spacing dimension between the outer lateral edge of the baffle plate and the inner surface of the side wall, s.

For example, the baffled disperser may be constructed, arranged, and operated to satisfy at least one of the following dimensional criteria:

interior volume of the housing, $V_i$:

$$2,000 < V_i < 10^6 \text{ cm}^3;$$

lateral dimension (diameter) of the housing, D:

$$D > 20 \text{ cm.};$$

interior axial length of the housing (from the rear wall to the front wall), L:

$$2 < L < 15 \text{ cm.};$$

total cross-sectional area of baffle plate(s), $A_b$:

$$500 < A_b < 2,000 \text{ cm}^2;$$

baffle plate(s) thickness, t:

$$0.05 < t < 5 \text{ cm};$$

baffle plate position along the z-axis of the housing, z/L, measured from the front wall:

$$0.2 < z/L < 0.8; \text{ and}$$

ratio of lateral dimension (diameter) of the baffle plate, d, to lateral dimension (diameter) of the housing, D:

$$0.8 < d/D < 1.$$

In another aspect, the invention relates to a CVD system comprising a showerhead disperser as described hereinabove, joined via its feed conduit assembly to a source of precursor reagent(s) and a second vapor to be mixed in the disperser housing interior volume with the precursor reagent(s) to form a source reagent vapor mixture, and arranged in vapor discharge relationship to a substrate in the CVD reactor, for flow of the source reagent vapor mixture to the substrate for deposition of selected component(s) of the precursor reagent(s) on the substrate.

In such CVD system, the disperser and the substrate may be arranged such that the substrate is coaxially and parallelly arranged with respect to the disperser housing front wall along the flow path of the source reagent vapor mixture. Preferably, the ratio of the lateral dimension (diameter) of the housing, D, to the axial spacing distance, B, between the front wall of the disperser housing and the deposition substrate, with both being measured in the same dimensional units, is governed by the relationship:

$$3 \leq D/B \leq 12,$$

and most preferably 4<D/B<8.

Other aspects, features, and embodiments of the invention will be more fully apparent from the ensuing disclosure and appended claims.

DETAILED DESCRIPTION OF THE INVENTION, AND PREFERRED EMBODIMENTS THEREOF

The showerhead disperser of the present invention is the mixing of multiple feed vapor streams to form a highly homogeneous vapor mixture therefrom, and for discharging the homogeneous vapor mixture in a highly uniform flow for subsequent usage downstream from the disperser.

Such showerhead disperser has particular utility in CVD applications, for mixing of precursor reagent(s), oxidants, adjuvants, carrier gases, or other vapor streams, to produce a highly homogeneous vapor mixture and discharging same onto a deposition substrate. It will be recognized, however, that the showerhead disperser of the invention may be utilized for the mixing and discharge of a wide variety of fluid streams, for a corresponding variety of other end use applications.

Figure 1:
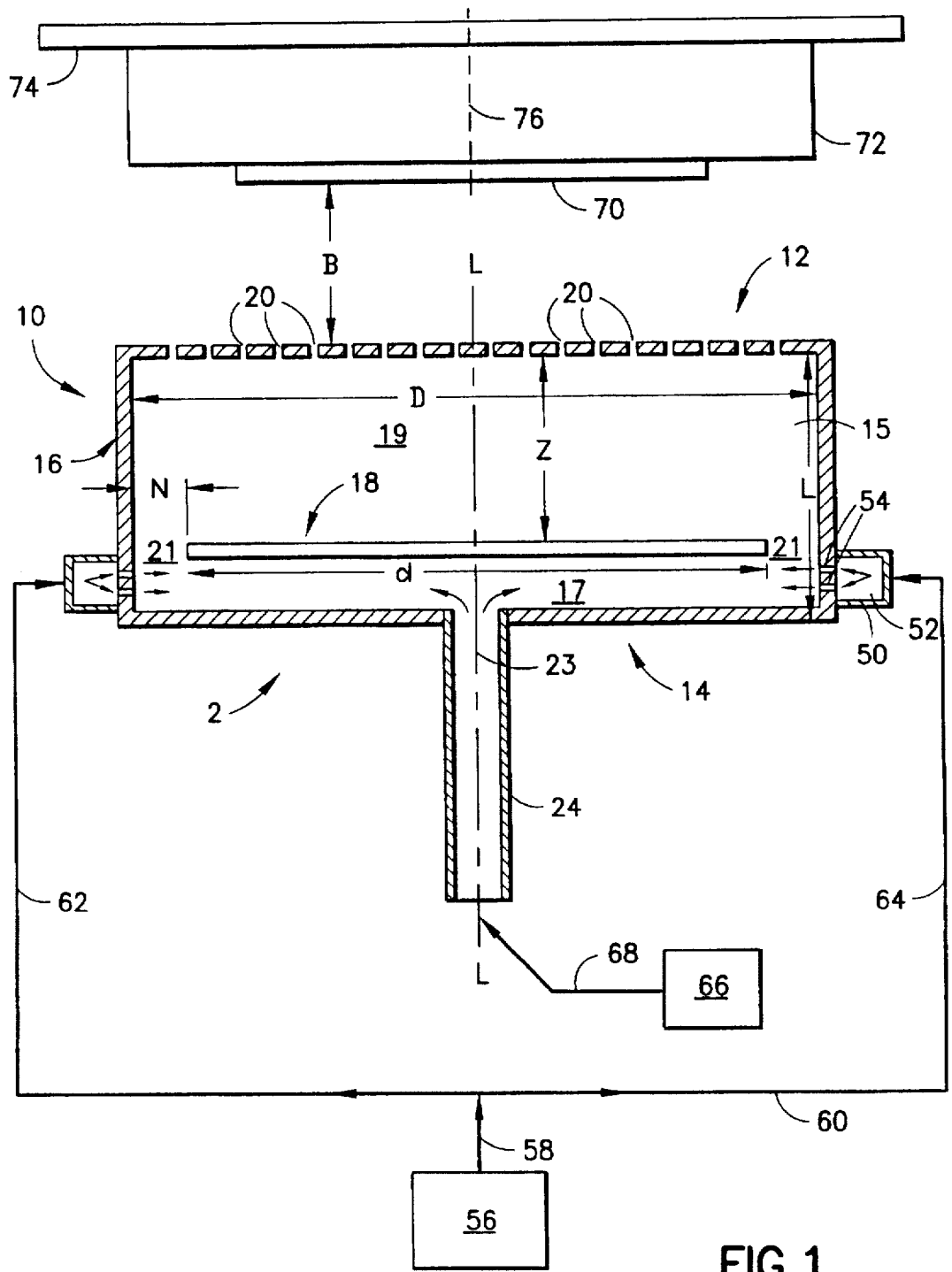
FIG. 1 is a side cross-sectional view of a showerhead dispenser device according to one embodiment of the present invention.

Referring now to FIG. 1, a showerhead disperser device 2 according to one embodiment of the present invention is shown in an elevational cross-sectional view. This showerhead disperser device 2 comprises a housing 10 having front and rear walls 12,14, respectively. It will be understood that the housing 10 itself may be of any suitable size and shape, but it is generally preferred that the front and rear walls 12,14 be substantially parallel to, and spaced-apart from, one another, such that the axial distance between the walls 12,14 (measured in a direction coincident or parallel to the axial centerline L—L of the housing) is constant over the transverse extent of the housing (the transverse, or lateral, direction being taken here as the direction perpendicular to the axial centerline). Such regular geometry of the housing ensures a substantially uniform residence time for the vapors being mixed in the housing, thereby facilitating the homogeneous mixing of the respective vapor steams in the interior volume 15 of the housing.

The housing 10 further comprises a side wall 16 which with the front and rear walls of the housing encloses the interior volume 15 of the housing. It is preferred, to achieve high uniformity in the composition of the vapor mixture formed in the housing, as well as flow rate and velocity uniformity, to utilize a regular geometry in the housing, such as a cylindrical housing as illustratively shown in the drawings herein, or other regular geometry, e.g., a housing having a constant cross-section of square, rectangular, hexagonal, octagonal, or other circumferentially regular shape.

The housing 10 may be formed of any suitable material of construction, such as for example metal, ceramic, high temperature polymer, etc., which is compatible with the fluid streams being processed for mixing and discharge, and which retains structural integrity at the process conditions involved in the operation of the disperser unit.

This housing 10 as shown includes a baffle plate 18 which is disposed in the housing interior volume, preferably mounted so as to be generally parallel with each of the front and rear walls 12,14. The baffle plate 18 is positioned in the housing at an axial position (measured by the distance along axial centerline L—L) which is spaced-apart from each of such front and end walls. The axial distance between the front wall 12 and the rear wall 14 is shown in FIG. 1 as L (as measured parallel to the axial centerline L—L). The axial distance measured from the front wall to the baffle plate 18 in the FIG. 1 system is shown as the dimension z. The fractional axial spacing distance of the baffle plate from the front wall then is measured by the parameter z/L.

The baffle plate 18 may be held in place by stanchions (or other support means; not shown in FIG. 1, for clarity) which may be attached at a variety of points on the inner surface of the housing 10. It is understood, however, that such stanchions or other structural supports for the baffle plate(s) mounted in the housing should be constructed and arranged so as to not deleteriously interfere with the mixing efficacy of the interior structure of the housing or the development of uniform flow of the vapor mixture to be discharged at the front wall of the housing.

The baffle plate may likewise be formed of any suitable material of construction, e.g., metal, ceramic, high temperature polymer, etc., and preferably is of generally planar form, having main upper and lower faces derming a thickness therebetween of suitable dimension.

The baffle plate divides the interior volume 15 of the housing into a lower interior volume region 17, and an upper interior volume region 19. The baffle plate 18 has a diameter d (see FIG. 1) which is smaller than the inner diameter of the housing, measured by the transverse distance D between the opposite surfaces of the side wall 16 in the FIG. 1 drawing.

The baffle plate arrangement shown in FIG. 1 provides an annular spacing 21 (between the outer or peripheral edge of the baffle plate, and the transversely adjacent wall surface of the side wall 16) for vapor flow from the lower interior volume region 17 to the upper interior volume region 19. In such annular spacing construction, it is desirable for the baffle plate 18 to be coaxial with the cylindrical housing 10, so that the annular spacing 21, shown in the drawing of FIG. 1 as N, is of a radially uniform dimension around the entire periphery (circumference) of the baffle plate.

The front wall 12 of the housing 10 features an array of gas discharge openings 20 therein, for discharge of mixed vapor from the interior volume 15 of the housing 10 frontally of the housing. The array of gas discharge openings is preferably of a geometrically uniform or regular pattern, to assist in ensuring that the flow of the discharged vapor mixture is uniform across the full transverse extent of the front wall of the housing.

Located in axially spaced relation to the front wall 12 of the housing 10 is a substrate 70, which may for example comprise a semiconductor wafer, wafer base, or other substrate article, which is mounted on a base or support 72 (e.g., a susceptor) which in turn is mounted on the wall 74 of the CVD reactor. The substrate 70 preferably is located in coaxial and substantially parallel relationship with respect to the front wall of the housing (the substrate 70 having an axis 76 as shown in FIG. 1 which is coincident with the axial centerline L—L of the housing).

When the showerhead disperser of the present invention is utilized for CVD deposition on a substrate of selected component(s) from a source vapor mixture, the dimensional ratio of the diameter D of the housing (see FIG. 1) to the axial spacing distance B between the front wall of the housing and the facing surface of the substrate should be in the range of $3 \leq D/B \leq 12$, and most preferably $4 \leq D/B \leq 8$. By way of specific example, a suitable value of D/B in the deposition of films such as the $Ba(thd)_2$, $Sr(thd)_2$, PLT, SBT, and PZT, may on the order of about 6.

The rear wall 14 of the housing 10 as shown in FIG. 1 includes an opening 23 joined in closed flow communication with a conduit 24, as for example by welding, brazing, or otherwise leak tightly joining the conduit 24 to the rear wall 14. The conduit 24 is schematically shown as being joined by feed line 68 to a source 66 of vapor, such as a metal organic vapor containing the material to be deposited on the substrate 70 subsequent to mixing in the interior volume of the housing. Thus the vapor from source 66 is fed through the interior passage of the conduit 24 and opening 23 in the rear wall 14 for flow into the interior volume of the housing, being uniformly distributed in the housing interior volume by the action of the baffle plate 18.

A second fluid, e.g., an oxidant or carrier gas, from source 56 is flowed into feed line 58 and manifold 60 to branch lines 62 and 64 for flow into the feed ring 50. The feed ring 50 circumscribingly surrounds the side wall of the housing 10 at a lower portion of the side wall as shown, and defines therewithin a plenum space 52 communicating in vapor flow communication via vapor feed openings 54 with the interior volume of the housing. The vapor feed openings 54 are provided around the entire periphery of the housing side wall in communication with the plenum space 52, so that the vapor from source 56 is distributed radially inwardly into the interior volume of the housing around the full circumference of the side wall through the vapor feed openings 54.

By the arrangement shown in FIG. 1, the precursor reagent from source 66 and the oxidant or other vapor medium from source 56 to be mixed therewith, are transported into the interior volume of the showerhead 10 and uniformly mixed therein at the annular mixing locus 21, for subsequent discharge at the front wall of the housing through the openings 20.

It will be recognized that the number, type, and location of the fluid introduction means may be widely varied in the broad practice of the invention. In general, it is desirable to introduce the respective fluids at a rearward portion of the housing, so as to permit an adequate mixing path for interchange of the fluids to ensure appropriate homogeneity thereof. At the same time, in the case of applications such as CVD involving fluid streams which are susceptible to reaction, decomposition, or degradation in situ in the housing, it is desirable that the flow path lengths of the respective fluids in the housing not be so excessive as to result in deleterious deterioration or cross-reaction of the fluid stream components in the housing interior volume. It therefore is preferred in such applications that the aspect ratio of L/D (see FIG. 1) be less than 1, and more preferably in the range of from about 0.05 to about 0.80.

Figure 2:
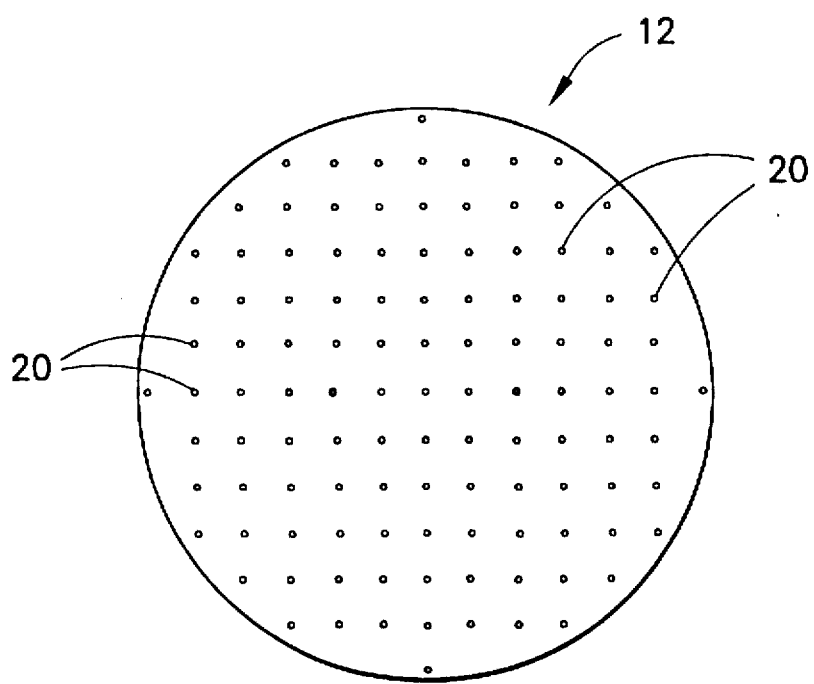
FIG. 2 is a top plan view of the front wall of the housing member of a disperser device of the present invention showing the vapor flow openings therein.

FIG. 2 is a top plan view of the front wall 12 of the showerhead disperser 2 of FIG. 1, showing the geometrically regular pattern of vapor mixture discharge openings, whereby the vapor mixture is discharged at a uniform flow rate and velocity across the entire face of the front wall of the housing. It will be recognized that the openings 20 in the front wall may be of constant or varying size relative to one another (in the case of varying size, preferably being compensated by the spacing (hole-to-hole distance) of the opening pattern, but preferably being of uniform size and shape, and being uniformly distributed across the face of the front wall of the housing.

Figure 3:
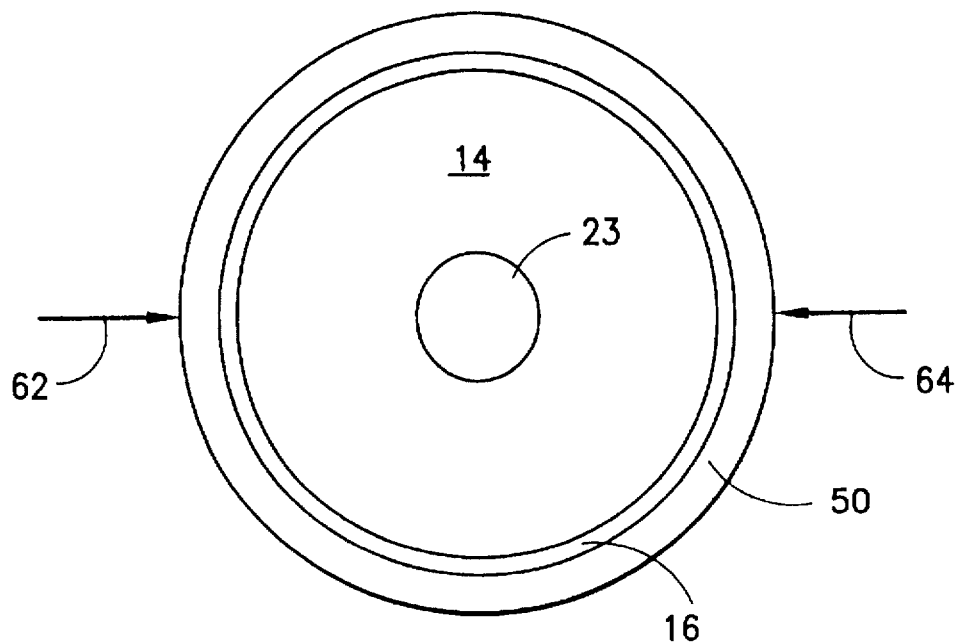
FIG. 3 is a plan view of the rear wall member of the showerhead disperser device of FIG. 1.

FIG. 3 is a plan view of the exterior surface of the rear wall 14 of the housing as shown in FIG. 1, with the feed ring 50 being joined to the side wall 16 which in turn is joined to (or integrally formed with) rear wall 14. The feed ring is schematically shown as being fed with vapor through feed lines 62 and 64. The central circular opening 23 of the rear wall 14 is illustrated (without feed conduit 24 joined thereto, for purposes of clarity; see FIG. 1).

Figure 4:
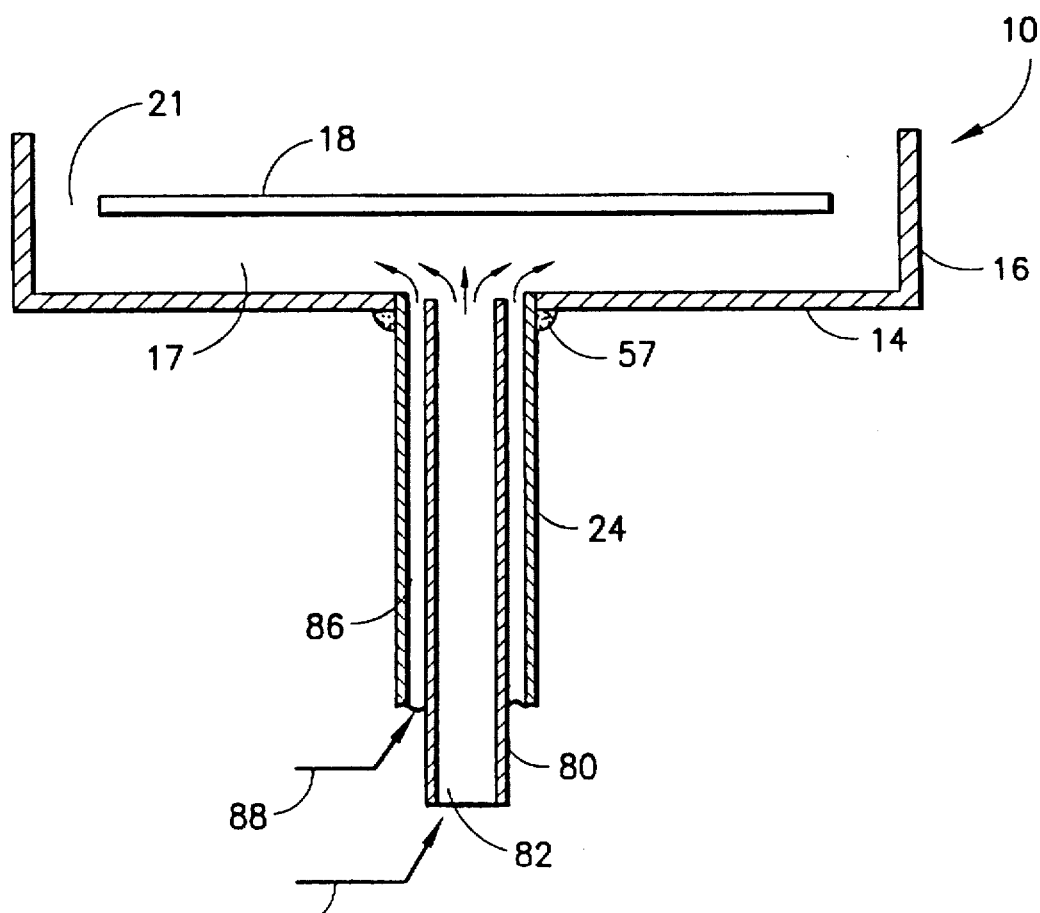
FIG. 4 is a partial cross-sectional view of a showerhead disperser device of a type as shown in FIG. 1, but with the provision of a coaxially arranged feed conduit assembly for introducing oxidant and precursor reagent to the interior volume of the housing for mixing therein.

FIG. 4 is a side cross-sectional elevation view of a portion of a disperser housing 10 according to another embodiment of the invention (with all corresponding parts and elements in FIG. 4 being numbered correspondingly with respect to FIG. 1 for ease of reference).

In the FIG. 4 disperser, the housing comprising rear wall 14 and side wall 16 (front wall not shown) defines an interior volume therewithin including a lower interior volume region 17. A baffle plate 18 is mounted in the interior volume, in axially spaced relationship to the rear (and front) wall. The rear wall features a central circular opening to which is leak-tightly joined in closed vapor flow communication a first vapor feed conduit 24 which is joined to the rear wall by circumferential bond 57 such as a weld. The first vapor feed conduit 24 defines therein a first vapor flow passage 86 which may be supplied with first vapor by feed line 88 from a suitable vapor source (not shown). Coaxially located in the interior passage 86 is a second vapor feed conduit 80 defining therein a second vapor flow passage 82 supplied by feed line 84 with second vapor from a suitable source (not shown).

By the arrangement shown in FIG. 4, the first and second vapor streams are conveyed into the housing for mixing in the interior volume therein, beneath the baffle plate 18. The resulting mixed vapor flows radially outwardly to the periphery of the housing to the annular space 21, from which the mixed vapor flows upwardly and spreads across the full cross-section of the housing interior volume for subsequent discharge through the vapor discharge openings in the front wall of the housing.

Figure 5:
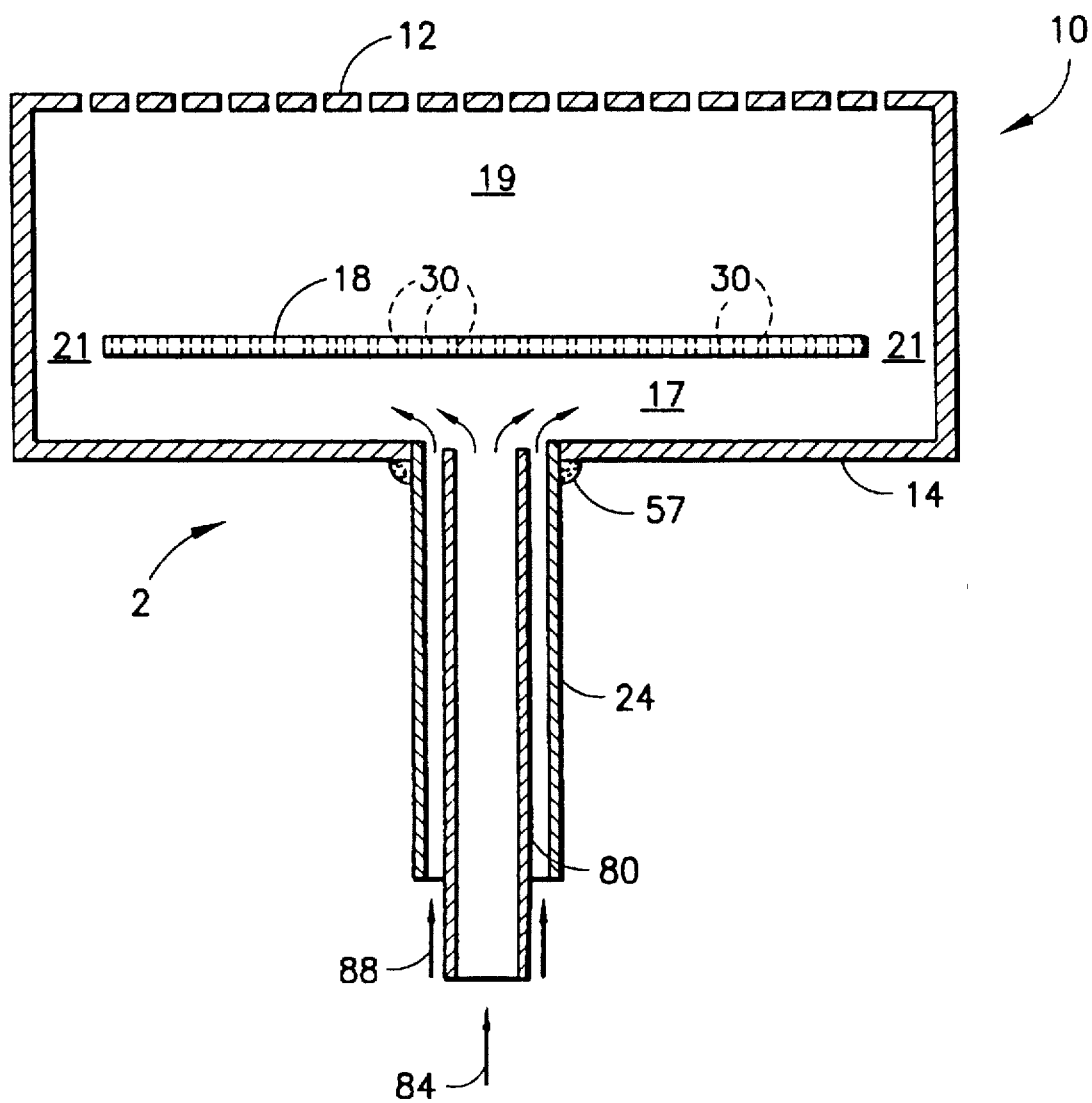
FIG. 5 is a side elevational view, in cross-section, of a showerhead dispenser device according to another embodiment of the present invention, wherein the baffle plate is of perforate character.

FIG. 5 is a side elevational view, in cross-section, of a still further embodiment of the disperser of the present invention, wherein corresponding parts are numbered correspondingly to FIGS. 1 and 4, as appropriate. In the FIG. 5 system, the baffle plate 18, in contrast to the baffle plate in the FIGS. 1 and 4 embodiments, is perforate in character, having an array of openings 30 therein, for further distributing the vapor mixture across the full transverse cross-section of the housing interior volume. Such openings 30 are preferably of uniform size and spacing in the array thereof extending through the baffle plate.

The openings 30 may be axially aligned with the centerline L—L of the housing 10. These openings provide channels through which the first and second vapor streams may pass and be mixed. It is to be understood that the openings 30 of the baffle 18 may be non-axially oriented such that the vapors flowing therethrough are imparted with a swirling trajectory, to enhance the mixing thereof.

Figure 6:
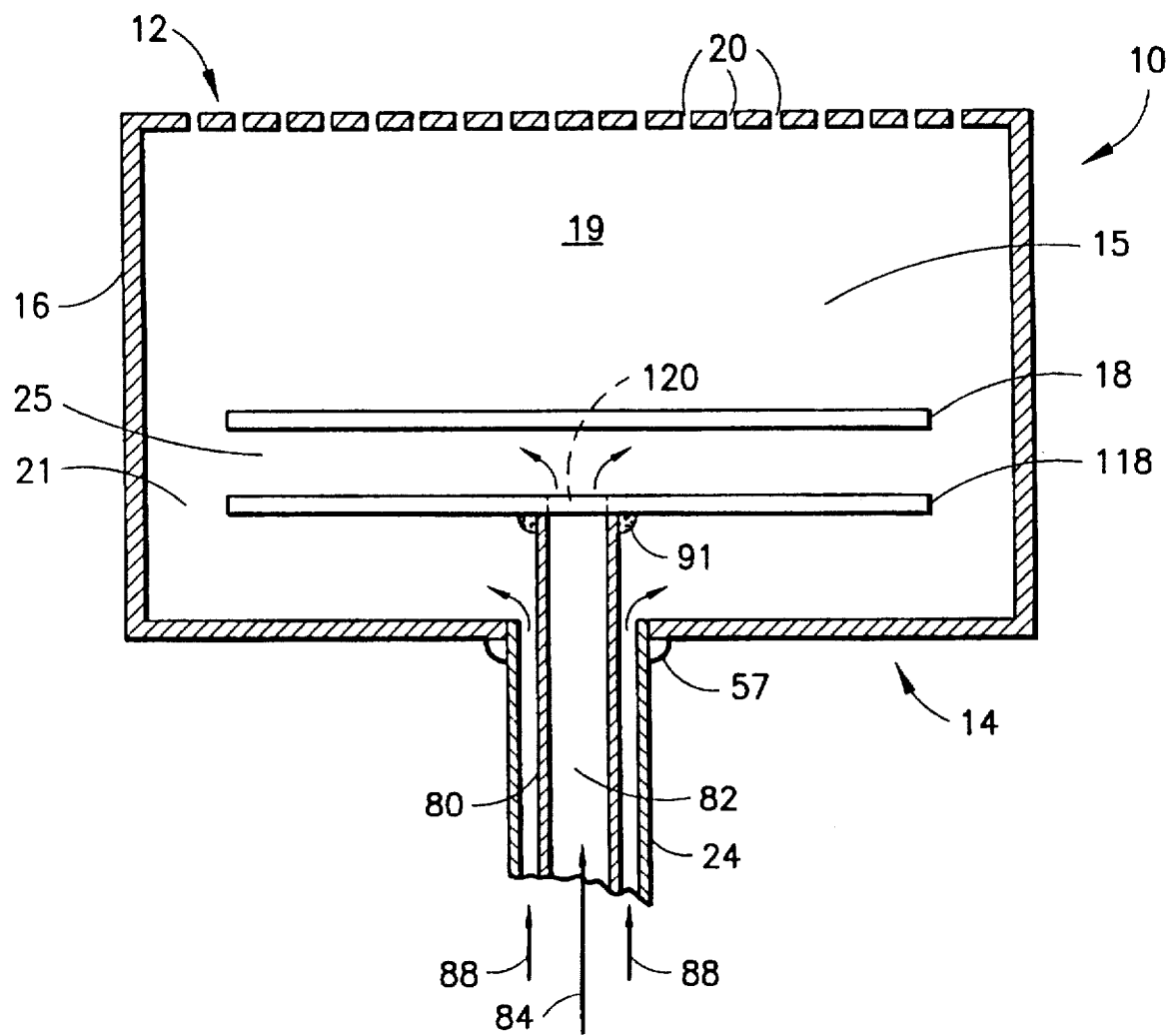
FIG. 6 is a cross-sectional side elevational view of a showerhead disperser device according to still another embodiment of the present invention comprising a pair of imperforate spaced-apart baffle plates and a concentric conduit assembly for introducing precursor reagent and oxidant media into the interior volume of the housing for mixing therein.

FIG. 6 is a cross-sectional elevation view of a disperser according to yet another embodiment of the invention wherein all corresponding parts are numbered correspondingly to FIGS. 1 and 4, as appropriate.

As shown in FIG. 6, the housing 10 has two baffle plates 18 and 118 mounted therein, in axially spaced-apart relationship to one another, and each having an outer periphery which is in radially spaced relationship to the facing inner surface of the side wall 16. The second vapor flow conduit 80 is joined to the underside of baffle plate 118, being secured by bond 91, which may comprise a welding or brazing line providing leak tight connection to the plate. The plate comprises a central opening 120 therein, which is in closed flow communication with the interior passage 82, for flow of second vapor through the interior passage 82 to the opening 120 in baffle plate 118 for radial outward flow through the interplate volume 25 between the respective baffle plates 18 and 118.

The first vapor in the system shown in FIG. 6 is flowed through the annular passage between first conduit 24 and second conduit 80 and enters the interior volume of the housing beneath baffle plate 118, for flow radially outwardly to the annular mixing locus 21, at which the first vapor and second vapor are mixed and then flow forwardly (toward the front wall of the housing) in the interior volume of the housing, while spreading transversely over the full transverse cross-section of the housing interior volume, for subsequent discharge at the front wall of the housing through the gas discharge openings 20. The process of redirecting the flow of the respective introduced streams, as well as the flow of the respective vapors through the narrow annular spacing 21 provides enhanced mixing as compared with the mixing which would occur in the absence of the baffle plates.

It will be recognized that any directional references that are used herein with respect to the injector structures shown in the drawings, are employed solely for the purpose of describing the orientation or configuration of the apparatus shown, and that the embodiments illustratively shown may be arranged in positions that are opposite, inverted, rotated, or otherwise displaced with respect to those specifically shown and described herein.

In the use of the disperser of the invention for CVD applications, it is generally preferred to maintain pressures within the housing on the order of 0.5–50 Torr, e.g., 1–5 Torr, so that the extent of mixing of the first and second vapor streams is primarily related to the linear distance traveled by the respective vapors while in contact, and therefore, a baffle plate which is imperforate (such as is shown in FIGS. 1, 4, 5, and 6) is generally preferred in practice over perforate baffle plates. It will be recognized that the number of baffle plates employed in a given end use application of the present invention may be widely varied, and that one, two or more baffle plates may be variously employed, as may readily determined by the skilled artisan, without undue experimentation, having reference to the number and type of streams to be mixed, the nature and extent of the mixing, the location and type of the downstream locus at which the mixed discharged vapor is to be utilized, the process conditions in the overall system in which the disperser is to be deployed, etc.

The dimensions of the disperser of the present invention may be widely varied in the broad practice of the present invention depending on the nature of the mixing operation, the identity of the specific streams to be mixed, and the downstream usage of the mixed discharged vapor from the disperser. Accordingly, the following variables are susceptible of variation as design variables in the practice of the invention:

the interior volume of the housing, $V_i$;

the lateral dimension (diameter) of the housing, D;

the interior axial length of the housing (from the rear wall to the front wall), L;

the total cross-sectional area of baffle plate(s), $A_b$;

the area (total) of the front wall vapor discharge openings, $A_o$;

the baffle plate(s) thickness, t;

the baffle plate position along the z-axis of the housing, z/L (z being taken here as the distance measured from the front wall of the housing);

the diameter of the baffle plate openings (when the baffle is of perforate or foraminous character), d;

the volumetric flow rate of precursor (or other first fluid) into the disperser housing, $Q_p$;

the volumetric flow rate of oxidant or other feed stream (second fluid) introduced in the interior volume of the housing for mixing therein with the precursor stream, $Q_o$;

the cross-sectional area of precursor (first fluid) feed conduit, $A_f$;

the cross-sectional area of oxidant (or other second fluid) feed conduit, $A_g$; and the annular radial spacing dimension between the outer lateral edge of the baffle plate and the inner surface of the side wall, s.

In the preferred practice of the invention, wherein an MOCVD precursor reagent and an oxidant are being mixed, the baffled disperser may be constructed, arranged, and operated to satisfy one or more, and most preferably all, of the following dimensional criteria:

interior volume of the housing, $V_i$:

$$2,000 < V_i < 10^6 \text{ cm}^3;$$

lateral dimension (diameter) of the housing, D:

$$D > 20 \text{ cm.};$$

interior axial length of the housing (from the rear wall to the front wall), L:

$$2 < L < 15 \text{ cm.};$$

total cross-sectional area of baffle plate(s), $A_b$:

$$500 < A_b < 2,000 \text{ cm}^2,$$

baffle plate(s) thickness, t:

$$0.05 < t < 5 \text{ cm};$$

baffle plate position along the z-axis of the housing, z/L, measured from the front wall:

$$0.2 < z/L < 0.8; \text{ and}$$

ratio of lateral dimension (diameter) of the baffle plate, d, to lateral dimension (diameter) of the housing, D:

$$0.8 < d/D < 1.$$

In use of the disperser of the present invention for mixing of vapor streams including metal-organic reagents and oxidant for CVD usage, the disperser and the deposition substrate are preferably arranged with the substrate coaxially and parallelly arranged with respect to the disperser housing front wall along the flow path of the source reagent vapor mixture, with the ratio of the lateral dimension (diameter) of the housing, D, to the axial spacing distance, B, between the front wall of the disperser housing and the deposition substrate, with both being measured in the same dimensional units, being in the range of $3 \leq D/B \leq 12$, and most preferably in the range of $4 \leq D/B \leq 8$. The Reynolds number associated with the laminar flow through the housing in such application may be desirably in the range of 5–25 in magnitude, e.g., on the order of about 10.

In a particular embodiment of the invention, utilizing a structure of the type shown in FIG. 1 (single baffle plate) or FIG. 6 (double baffle plate), with a double vapor conduit assembly as shown in FIG. 6, the housing may have a diameter D of 12 inches, with the front wall of the housing spaced from the deposition substrate at a distance of 1–3 inches. The first vapor conduit may have an outer diameter of 0.75 inch and an inner diameter of 0.625 inch. The second vapor conduit (circumscribing and concentric with the first vapor conduit) may have an outer diameter of 1.25 inches and an inner diameter of 1.0 inch. The gas discharge openings in the front wall of the housing may have a cross-sectional area on the order of 0.08 cm$^2$ with 1.27 cm. center to center spacing, in a regular array of such openings. The thickness of the baffle plate(s) in such embodiment may be 1/16 inch, the radius of the housing may be 11.67 cm. In a two baffle plate embodiment, the axial spacing between the rear wall and the first baffle plate may be on the order of 1.90 cm., the axial spacing between the first baffle plate and the second baffle plate is 1.76 cm., and the axial spacing between the second baffle plate and the front wall of the housing is 3.18 cm. The annular spacing dimension between the baffle plate and the side wall (radial distance between the baffle plate edge and the facing side wall of the housing) is 0.4 cm. In a single baffle plate embodiment, the axial spacing between the rear wall and the baffle plate is 1.90 cm., the axial spacing between the baffle plate and the front wall of the housing is 5.08 cm., and the annular spacing dimension between the baffle plate and the side wall is 0.4 cm.

In the practice of the present invention, the baffled disperser unit has been found to reduce the variation in composition and flow rate to remarkably low levels, on the order of 1% or less. As a result, the CVD films produced with the aid of mixing of precursor reagent streams with oxidant streams achieves a degree of homogeneity in composition and uniformity of thickness heretofore not achieved in the art. The invention thus has utility in CVD applications which require superior levels of compositional and dimensional uniformity in the deposited thin film, such as for example the formation of films of barium strontium titanate (BST).

Although the invention has been described hereinabove in reference to selected features, aspects, and embodiments, it will be recognized that the utility of the invention is not thus limited, and that numerous variations, modifications and other embodiments are contemplated, and accordingly the invention is to be broadly construed to encompass all such variations, modifications and other embodiments, as being wig its spirit and scope as claimed.

What is claimed is:

1. A showerhead disperser device for mixing plural fluid streams, comprising:

a housing including front and rear walls in spaced apart relation to one another, and a side wall therebetween, defining within the housing an interior volume;

the front wall having a multiplicity of mixed fluid discharge openings therein, for discharging mixed fluid from the interior volume of the housing exteriorly thereof;

flow passages joined to the housing for introducing into the interior volume of the housing respective fluids to be mixed therein; and at least one baffle plate mounted in the interior volume of the housing, intermediate the front and rear walls of the housing, the baffle plate having an edge in spaced relation to the side wall to form an annular flow passage therebetween and the baffle plate having at least one of the respective fluids directed against a central portion thereof upon introduction thereof through one of the flow passages to the interior volume of the housing, for outward flow thereof towards the annular flow passage and subsequent distribution thereof in the interior volume of the housing;

another of said flow passages introducing at least another of the respective fluids for flow into the annular flow passage against the outwardly flowing fluid and mixing therebetween in the annular flow passage, forming mixed fluid for flow through the interior volume of the housing to the front wall thereof and discharge through the mixed fluid discharge openings in said front wall.

2. A showerhead disperser according to claim 1, wherein the housing has a constant cross-section in an axial direction thereof.

3. A showerhead disperser according to claim 2, wherein the housing cross-section has a shape selected from the group consisting of circular, square, rectangular, hexagonal, and octagonal.

4. The device as set forth in claim 1, wherein the flow passages comprise a feed ring circumscribing the housing for introducing said at least another of the respective fluids into the annular flow passage against the outwardly flowing fluid for mixing therebetween in the annular flow passage.

5. A showerhead disperser according to claim 1, wherein said another of said flow passages introduces at least another of the respective fluids into the annular flow passage in an opposite flow direction for impingement against the outwardly flowing fluid and mixing therebetween in the annular flow passage, forming mixed fluid for flow through the interior volume of the housing to the front wall thereof and discharge through the mixed fluid discharge openings in said front wall.

6. A showerhead disperser according to claim 1, wherein the baffle plate is perforate, having an array of vapor flow openings therethrough.

7. A showerhead disperser according to claim 1, wherein the baffle plate is imperforate.

8. A showerhead disperser according to claim 1, wherein the side wall is cylindrical, and the housing has a uniform circular cross-section.

9. A showerhead disperser according to claim 1, of a predetermined size and shape with respect to the following variables:

interior volume of the housing, $V_i$;
lateral dimension of the housing, D;
interior axial length of the housing from the rear wall to the front wall, L;
total cross-sectional area of baffle plate(s), $A_b$;
baffle plate(s) thickness, t;
baffle plate position along the z-axis of the housing, z/L, measured from the front wall of the housing;
diameter of the baffle plate openings when the baffle plate is of perforated character, d;
wherein the showerhead disperser is constructed and arranged to satisfy at least one of the following parametric criteria:

$2,000 < V_i < 10^6$ cm$^3$;

$D > 20$ cm.;

$2 < L < 15$ cm.;

$500 < A_b < 2,000$ cm$^2$;

$0.05 < t < 5$ cm;

$0.2 < z/L < 0.8$; and $0.8 < d/D < 1$.

10. A showerhead disperser according to claim 9, wherein L/D is less than 1.0.

11. A showerhead disperser according to claim 9, wherein L/D is in the range of from 0.05 to 0.80.

12. A showerhead disperser according to claim 1, wherein the showerhead disperser is constructed and arranged to satisfy all of said parametric criteria.

13. A showerhead disperser device for mixing plural vapor streams, comprising:

a housing including front and rear walls in spaced apart relation to one another, and a side wall therebetween, defining within the housing an interior volume;

the front wall having a multiplicity of vapor mixture discharge openings therein, for discharging mixed vapor from the interior volume of the housing exteriorly thereof, flow passages joined to the housing for introducing into the interior volume of the housing respective fluids to be mixed therein; and two baffle plates mounted in the interior volume of the housing, in axially spaced apart relationship to one another and to the front and rear walls of the housing, each baffle plate having an edge in spaced relation to the side wall to form an annular flow passage therebetween and each baffle plate having respectively different ones of the respective fluids directed thereagainst upon introduction to the interior volume of the housing, for outward flow thereof to the annular flow passage and mixing of the respective fluids in the annular flow passage, forming mixed fluid for flow through the interior volume of the housing to the front wall thereof and discharge through the mixed fluid discharge openings in said front wall.

14. A showerhead disperser according to claim 13, wherein each of the baffle plates is imperforate.

15. A CVD system including a showerhead discharge device for delivering a source reagent vapor comprising a mixture of oxidant and precursor reagent to a CVD reactor for deposition on a substrate therein, said showerhead discharge device comprising:

a housing including front and rear walls in spaced apart relation to one another, and a side wall therebetween, defining within the housing an interior volume;

the front wall having a multiplicity of mixed fluid discharge openings therein, for discharging mixed fluid from the interior volume of the housing exteriorly thereof;

flow passages joined to the housing for introducing into the interior volume of the housing respective fluids to be mixed therein; and at least one baffle plate mounted in the interior volume of the housing, intermediate the front and rear walls of the housing, the baffle plate having an edge in spaced relation to the side wall to form an annular flow passage therebetween and the baffle plate having at least one of the respective fluids directed against a central portion thereof upon introduction thereof through one of the flow passages to the interior volume of the housing, for outward flow thereof towards the annular flow passage and subsequent distribution thereof in the interior volume of the housing;

another of said flow passages introducing at least another of the respective fluids for flow into the annular flow passage against the outwardly flowing fluid for mixing therebetween in the annular flow passage to form mixed fluid flowed through the interior volume of the housing to the front wall thereof for discharge through the mixed fluid discharge openings in said front wall;

a source of precursor reagent(s) and a second vapor to be mixed in the disperser housing interior volume with the precursor reagent(s) to form a source reagent vapor mixture, joined in supply relationship to said flow passages;

a CVD reactor having a substrate mount therein;

the housing being arranged in vapor discharge relationship to the substrate mount in the CVD reactor, for flow of the source reagent vapor mixture to a substrate mounted on the substrate mount, for deposition of selected component(s) of the precursor reagent(s) on the substrate.

16. A CVD system according to claim 11, wherein the substrate mount and the showerhead discharge device are arranged such that the substrate mount is coaxially and parallelly arranged with respect to the disperser housing front wall along a flow path of the source reagent vapor mixture.

17. A CVD system according to claim 15, wherein the ratio of lateral dimension of the housing, D, to axial spacing distance, B, between the front wall of the showerhead discharge device housing and the substrate mount, with both being measured in the same dimensional units, is:

$$3 \leq D/B \leq 12.$$

18. A CVD system according to claim 17, wherein the ratio of lateral dimension of the housing, D, to axial spacing distance, B, between the front wall of the showerhead discharge device housing and the substrate mount, with both being measured in the same dimensional units, is:

$$4 \leq D/B \leq 8.$$

* * * * *

UNITED STATES PATENT AND TRADEMARK OFFICE
CERTIFICATE OF CORRECTION

PATENT NO.  : 5,741,363
DATED       : April 21, 1998
INVENTOR(S) : Van Buskirk et al.

It is certified that error appears in the above-indentified patent and that said Letters Patent is hereby corrected as shown below:

| | |
|---|---|
| Column 2, line 56 | change "BIST" to --BaST-- |
| Column 6, line 4 | after "invention is" insert --particularly adapted for-- |
| Column 7, line 12 | change "derming" to --defining-- |
| Column 12, line 40 | change "wig" to --within-- |

Signed and Sealed this

Twenty-fourth Day of November,1998

Attest:

BRUCE LEHMAN

Attesting Officer     Commissioner of Patents and Trademarks